(12) United States Patent
Gneupel (10) Patent No.: US 11,480,611 B2
(45) Date of Patent: Oct. 25, 2022

(54) PROBER WITH COOLING MECHANISM FOR DIRECTLY COOLING A DEVICE UNDER TEST

(71) Applicant: Infineon Technologies AG, Neubiberg (DE)

(72) Inventor: Andreas Gneupel, Dresden (DE)

(73) Assignee: Infineon Technologies AG, Neubiberg (DE)

(*) Notice: Subject to any disclaimer, the term of this patent is extended or adjusted under 35 U.S.C. 154(b) by 30 days.

(21) Appl. No.: 17/082,435

(22) Filed: Oct. 28, 2020

(65) Prior Publication Data

US 2021/0123971 A1    Apr. 29, 2021

(30) Foreign Application Priority Data

Oct. 28, 2019  (DE) .................. 10 2019 128 942.4

(51) Int. Cl.
| | | |
|---|---|---|
| G01R 31/26 | (2020.01) | |
| G01R 31/28 | (2006.01) | |
| G01R 1/067 | (2006.01) | |
| G01R 1/073 | (2006.01) | |

(52) U.S. Cl.
CPC ..... G01R 31/2887 (2013.01); G01R 1/07342 (2013.01); G01R 31/2877 (2013.01)

(58) Field of Classification Search
CPC ........ G01R 31/02; G01R 31/26; G01R 31/28; G01R 1/02; G01R 1/067; G01R 1/073; H01L 21/68
See application file for complete search history.

(56) References Cited

U.S. PATENT DOCUMENTS

| | | | |
|---|---|---|---|
| 5,088,006 A | | 2/1992 | del Puerto et al. |
| 5,198,752 A | * | 3/1993 | Miyata ............... G01R 1/07314 165/80.4 |
| 5,203,401 A | | 4/1993 | Hamburgen et al. |
| 6,415,858 B1 | | 7/2002 | Getchel et al. |
| 6,549,026 B1 | * | 4/2003 | DiBattista .......... G01R 31/2891 324/750.09 |
| 6,857,283 B2 | | 2/2005 | Tilton et al. |
| 7,700,379 B2 | | 4/2010 | Haji-Sheikh et al. |
| 2002/0017916 A1 | | 2/2002 | Costello et al. |
| 2002/0066726 A1 | * | 6/2002 | Cole, Sr. ........... H01L 21/67103 219/444.1 |
| 2006/0145715 A1 | | 7/2006 | Salmon |
| 2007/0024304 A1 | | 2/2007 | Itakura et al. |
| 2008/0136436 A1 | * | 6/2008 | Hong ................. G01R 31/2865 324/750.11 |

FOREIGN PATENT DOCUMENTS

DE          198 82 929          5/2008

* cited by examiner

*Primary Examiner* — Neel D Shah
(74) *Attorney, Agent, or Firm* — Dicke, Billig & Czaja, PLLC (57) ABSTRACT

Prober for a test system for testing a device under test is disclosed. In one example, the prober comprises a chuck configured for carrying the device under test, a transport circuitry for transporting electric signals to and/or away from the device under test. A cooling unit is directly thermally coupled with the device under test and configured for cooling the device under test at a main surface of the device under test facing the chuck.

18 Claims, 1 Drawing Sheet

PROBER WITH COOLING MECHANISM FOR DIRECTLY COOLING A DEVICE UNDER TEST

COSS-REFERENCE TO RELATED APPLICATION

This Utility Patent Application claims priority to German Patent Application No. 10 2019 128 942.4, filed Oct. 28, 2019, which is incorporated herein by reference.

BACKGROUND

Technical Field

Various embodiments relate generally to a prober for a test system for testing a device under test, a test system, and a method of testing a device under test.

Description of the Related Art

At the end of a manufacture of semiconductor chips or packages of such semiconductor chips, such products are usually tested concerning their function. For this purpose, a test system composed of a prober and an electric test unit is provided in which such products are tested as devices under test (DUT).

However, applying test signals to semiconductor chips of a wafer during testing may generate a considerable amount of heat which may deteriorate or even destroy the device under test or part thereof.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

The illustration in the drawing is schematically and not to scale.

There is a need for testing a device under test without the risk of deteriorating or even destroying the device under test or part thereof during testing.

According to an exemplary embodiment, a prober for a test system for testing a device under test is provided, wherein the prober comprises a chuck configured for carrying the device under test, a transport circuitry for transporting electric signals to and/or away from the device under test, and a cooling unit directly thermally coupled with the device under test and configured for cooling the device under test at a main surface of the device under test facing the chuck.

According to another exemplary embodiment, a test system for testing a device under test is provided, wherein the test system comprises a prober having the above-mentioned features and an electric test unit coupled with the transport circuitry of the prober for supplying electric stimulus signals (in particular for supplying electric stimulus signals to the device under test on the prober) to the prober and for analysing electric response signals from the prober (in particular for analysing electric response signals from the device under test on the prober).

According to yet another exemplary embodiment, a method of testing a device under test is provided, wherein the method comprises carrying the device under test by a chuck, transporting electric signals to and/or away from the device under test, and cooling the device under test, at a main surface of the device under test facing the chuck, by a cooling unit directly thermally coupled with the device under test.

According to an exemplary embodiment, a prober for a test system for DUTs (such as semiconductor wafers) is provided, in which a cooling unit is provided which is directly thermally coupled with the DUT on the DUT's main surface oriented towards the DUT carrying chuck. Thus, a direct (rather than merely indirect) thermal heat removal from the DUT to the cooling unit is established. As a consequence of the described direct cooling mechanism, the heat transfer from DUT to cooling unit is highly efficient and is not interrupted by a poorly thermally conductive intermediate body between DUT and cooling unit. As a consequence, the prober is highly appropriate for high power applications, for instance for testing power semiconductor chips of a wafer as DUT. In the framework of such a testing, it may also be highly desirable to burn-in the power semiconductor chips (for instance metal oxide semiconductor field effect transistor (MOSFET) chips and/or insulated gate bipolar transistor (IGBT) chips, or diodes or larger modules) so as to prevent an undesired increase of the on-resistance during actual use of the semiconductor chips. During such a burn-in procedure, a high amount of thermal energy may be generated which may excessively heat the DUT and may deteriorate or even damage the sensitive semiconductor chips thereof. By the direct rather than indirect heat removal mechanism provided by the cooling unit according to an exemplary embodiment, even enormous amounts of heat may be removed from the DUT. Thereby, a highly reliable test in a highly parallelized way may be carried out, and also a burn-in procedure may be carried out in a safe way. By cooling the device under test at a main surface of the device under test facing the chuck, the opposing other main surface of the device under test opposing (or facing away from) the chuck may remain free for being electrically connected with test needles or the like for freely supplying electric signals to substantially any desired portion of the upper main surface of the device under test. Moreover, cooling may be accomplished at that main surface of the device under test to which the electric signals have propagated after vertically flowing through the device under test in a DUT with vertical current flow. As a result, heat removal may be accomplished in a highly efficient way.

In the following, further exemplary embodiments of the prober, the test system, and the method will be explained.

In the context of the present application, the term "device under test" (DUT) may particularly denote an electronic component such as a semiconductor wafer or a semiconductor chip which shall be tested concerning its desired functionality after manufacture. In particular, the device under test may be an electronic member configured as a power semiconductor wafer or chip, for instance for automotive applications and in other technical fields.

In the context of the present application, the term "prober" may particularly denote a handling device for handling devices under test, in particular semiconductor wafers, in terms of testing their functionality by a test system. In particular, a prober may be the mechanical part of a test system which may cooperate with an electric test unit as an electronic part of the test system in terms of testing devices under test. An electric test of such a device under test may require the application of electric stimulus signals to one or both opposing main surfaces of the device under test, for instance to pads or other electrically conductive parts of chips of a wafer. The test may also require the detection and processing of electric response signals in reply to the application of the stimulus signals, wherein the response signals may be detected from one or both opposing main surfaces of the device under test, depending on the particularities of a certain application.

In the context of the present application, the term "chuck" may denote a rigid support body on which the DUT may be mounted, in particular indirectly via at least part of the cooling unit, etc.

In the context of the present application, the term "transport circuitry" may particularly denote electric circuitry providing an electrically conductive path in the prober for guiding electric signals (for instance in a unidirectional or preferably bidirectional way) between an electric test unit of the test system and the device under test.

In the context of the present application, the term "cooling unit" may particularly denote a mechanism or a device configured for cooling the device under test during testing and/or burn-in. Such a cooling unit may provide an active and/or passive cooling performance. A passive cooling performance may be a direct thermally conductive coupling between cooling unit and device under test, thereby allowing to remove heat generated in the device under test during the testing procedure by heat conduction. It is also possible that the cooling unit provides an active cooling, for instance by actively promoting heat conduction by a cooling fluid such as a cooling liquid.

In the context of the present application, the term "directly thermally coupled" may particularly denote a configuration in which at least a part of the cooling unit (for instance a cooling plate thereof) is thermally coupled for heat transfer with the device under test without a poorly thermally conductive body in between. In particular, the direct thermal coupling between the cooling unit and the device under test may be established by a direct physical contact between a surface of the device under test to be cooled and a cooling surface of the cooling unit. Furthermore, at least the part of the cooling unit being directly thermally coupled with the device under test may be itself highly thermally conductive, for instance may have a thermal conductivity of at least 10 W/mK, preferably at least 80 W/mK.

In an embodiment, the cooling unit comprises a cooling plate, in particular a circular cooling plate. Such a cooling plate may be a planar support body directly carrying the device under test with physical contact. By taking this measure, a proper thermal coupling can be established.

In an embodiment, the cooling unit is configured for cooling the device under test by a fluidic coolant being drivable through channels of the cooling unit. Such a fluidic coolant may be a liquid coolant (such as water, or HFE 7500© available from the company 3M©/3M™ Novec™ 7500 Engineered Fluid) or a gaseous coolant (such as an airflow or an oxygen flow). Such a coolant may for instance be guided through channels of the cooling unit.

In an embodiment, the cooling unit is configured for cooling the device under test by a liquid coolant. Using a liquid coolant provides for a particularly efficient cooling performance, since a liquid usually has a significantly higher thermal conductivity as compared to a gas.

In an embodiment, the cooling unit is configured for cooling the device under test by the fluidic coolant being drivable through spiral channels in the cooling unit, in particular bifilar spiral cooling tubes. It has turned out to be particularly efficient in terms of cooling to provide bifilar spiral cooling tubes in the cooling plate of the cooling unit. Such an embodiment is shown for instance in FIG. 2.

In an embodiment, the prober comprises an electrically insulating body sandwiched between the cooling plate of the cooling unit and the chuck. The mentioned electrically insulating body electrically decouples the device under test and its electronic environment from the (preferably grounded) chuck to thereby ensure that electric signals occurring during the test procedure are properly applied to the device under test and/or are properly supplied back to an electric test unit of the test system.

In an embodiment, the electrically insulating body is an electrically insulating plate, in particular a ceramic plate or a plastic plate. In particular a ceramic material is highly appropriate for the electrically insulating body. Arranging the electrically insulating body with the shape of a plate may allow to obtain a compact prober with reliable electric isolation.

In an embodiment, the cooling unit comprises an electrically conductive surface in contact with the device under test. For instance, an upper main surface of a cooling plate of the cooling unit may be in direct electric and in direct thermal contact with a lower main surface of the device under test, for instance a semiconductor wafer. The electrically conductive surface may form substantially an entire continuous main surface of the cooling plate. However, the electrically conductive surface may also be separated into multiple islands or pads.

In an embodiment, the transport circuitry is electrically coupled with the cooling unit for transporting electric signals to and/or away from the device under test via the cooling unit. This may be accomplished in particular via a cooling plate of the cooling unit. Highly advantageously, the cooling unit may also contribute to the transport of electric signals between the device under test and the electric test unit. For this purpose, it is preferred that a cooling plate of the cooling unit is electrically conductive so as to directly connect exposed pads on the surface of the device under test to be cooled.

Further alternatively, the upper main surface of the cooling plate may also be electrically insulating, for instance when there are no electric contacts on the lower main surface of the DUT. The embodiments described in the two preceding paragraphs may be advantageous in particular when power semiconductors such as MOSFETs, IGBTs and diodes or other vertical devices are tested in the device under test. In such electronic chips, the current flows from a front side of the wafer to a back side of the wafer. However, other exemplary embodiments may use lateral power semiconductors which may be cooled from a bottom side. Such devices under test may not have an electrically active back side, since all connections may be formed on the front side. In such an embodiment, an electrically conductive surface of the cooling unit may be dispensable. In other words, a cooling plate of a cooling unit does not necessarily have an electrically conductive surface and does not necessarily have to be electrically connected to a transport circuitry.

In an embodiment, the cooling unit comprises a first cooling path circulating a first coolant through a cooling plate in contact with the device under test. Moreover, the cooling unit may comprise a second cooling path with a second coolant (in particular driving a second coolant from a source to a drain or circulating a second coolant). Additionally, a heat exchanger may be provided for thermally coupling the first cooling path with the second cooling path so that heat is transferable from the first coolant to the second coolant. With such a concept of heat exchange between the first coolant (for instance HFE 7500© available from the company 3M©/3M™ Novec™ 7500 Engineered Fluid) and the second coolant (for instance water), a highly efficient heat removal from the device under test may be provided. Descriptively speaking, heat is supplied from the device under test during the testing operation to the first coolant which circulates and transfers the received heat to the second coolant in the heat exchanger. The heated second coolant may then be supplied to a drain of an open loop second cooling path or may circulate within a closed loop second cooling path. New or cooled recirculated second coolant may then be brought in thermal interaction with the first coolant in the heat exchanger, so that a continuous cooling cycle may be established. It may be advantageous that in particular the first coolant is temperature stable over a range of temperatures to which the device under test is heated during a burn-in procedure. Furthermore, in particular the first coolant should also be corrosion resistant. For instance, HFE 7500© available from the company 3M©/ 3M™ Novec™ 7500 Engineered Fluid may be temperature stable at least up to 120° C. and may thus be preferably used. The second coolant may be made of the same material as (for instance HFE 7500© available from the company 3M©/3M™ Novec™ 7500 Engineered Fluid) or a different material (for instance water) than the first coolant.

The second cooling path may be an open-loop cooling path transporting the second coolant from source to drain. However, alternatively, the second cooling path can also be embodied as a closed cooling circuit, which dissipates the heat received from the first coolant, for instance with air cooling. It is also possible that the heat transfer fluid in the primary cooling circuit is cooled directly by an air cooling.

In an embodiment, the transport circuitry comprises a needle card comprising electrically conductive contact elements (such as needles) configured for contacting the device under test, in particular for contacting the device under test from a top side. Said top side may be said main surface of the device under test facing away from the chuck. In particular, the electrically conductive contact elements may be spring contacts, such as pogo pins. Such a needle card may contact the device under test from above and may bring a plurality of electrically conductive needles (such as pogo pins) in direct electric contact with exposed electrically conductive pads of electronic chips of a wafer-type device under test. Descriptively speaking, the electric test signals may be applied from the needle card to the pads, may flow vertically through the semiconductor chips and may then flow out of the device under test on its lower main surface. The transport circuitry supplying said electric signals may then continue to supply back the detected signals from the cooling unit to the electric test unit of the test device.

In an embodiment, the cooling unit is configured for cooling the device under test with a thermal power capability of at least 5 kW, in particular of at least 10 kW. With a cooling power in the order of magnitude of 10 kW and above, it may also be possible that a wafer-type device under test may be tested and may be made subject to a burn-in procedure, most preferably in a massive parallel way.

In an embodiment, the method comprises carrying out a burn-in procedure for multiple (in particular for at least 10, more particularly for at least 50, preferably for at least 100) semiconductor chips of a wafer-type device under test simultaneously. With the above-described cooling architecture, it may become possible to carry out a high throughput burn-in procedure with a large number of (in particular power) semiconductor chips of a wafer simultaneously, since the enormous amount of heat created during such a procedure may be efficiently removed by the above-described cooling architecture.

In an embodiment, the electric test unit is configured for supplying burn-in stimulus signals to a wafer-type device under test for forcing bipolar degradation to the wafer-type device under test. In particular, the electric test unit may be configured for supplying the burn-in stimulus signals to multiple, in particular all, semiconductor chips of the wafer-type device under test in parallel. Correspondingly, the method may comprise supplying burn-in stimulus signals to a wafer-type device under test for forcing bipolar degradation to the wafer-type device under test, in particular simultaneously to multiple or all semiconductor chips of the wafer-type device under test. In particular, the method may comprise carrying out a burn-in procedure for forcing bipolar degradation to a wafer-type device under test on wafer level. In other words, it is possible to test multiple power semiconductor chips of the wafer-type device under test, and carry out a burn-in procedure for a group of power semiconductor chips or even for all semiconductor chips of the wafer at the same time. Highly advantageously, supplying burn-in stimulus signals to the wafer-type device under test may allow to burn-in material properties that influence the on-resistance in all or some electronic chips of the wafer so that such an undesired change of the performance of the semiconductor chips does not occur during operation, but during production of the chips. The cooling unit may support such a burn-in procedure by providing a high cooling power, thereby removing heat generated during the burn-in procedure. The burn-in procedure may be carried out for multiple electronic chips of a wafer-type device under test simultaneously, i.e. in a parallel way.

In particular, an embodiment carries out a burn-in procedure for all chips of a wafer simultaneously. However, another exemplary embodiment may carry out a burn-in procedure for a group of for instance a few hundred chips simultaneously (from for example about 500 to 5000 chips per wafer, depending on the chip type). The chips which are made subject to a common burn-in procedure may be electrically contacted and cooled in parallel. It is however highly advantageous if a group of chips made simultaneously subject to a common burn-in procedure (i.e. said hundred or more chips) are spatially (preferably evenly) distributed over the entire wafer surface. This may ensure that the heat is generated evenly over the whole surface wafer area and can then be transported away from the cooling unit.

In an embodiment, burn-in may be carried out for promoting bipolar degradation. It is however also possible that burn-in is carried out for addressing other effects. It is also possible that a non-burn-in test (i.e. a normal function test) is carried out which generates so much heat that cooling can be advantageously applied, as described herein.

For instance, a burn-in procedure causes the dissipation of about 100 W per chip of a wafer-type device under test. A typical time duration of a burn-in procedure is 15 minutes. It is furthermore desired to carry out a burn-in procedure simultaneously for multiple chips (for instance simultaneously for at least 50 chips, preferably at least 100 chips) to render the manufacturing process efficient in terms of throughput. This however requires a high performance heat removal architecture. Direct heat removal from the chuck-facing main surface of the device under test, as carried out by exemplary embodiments, is highly appropriate for this purpose.

In an embodiment, the method comprises attaching the device under test to rest on a plate-shaped cooling unit. Thus, the cooling plate of the cooling unit may be in direct physical contact with the lower main surface of the device under test and may rest on the latter. This may ensure a proper thermal coupling, without an electric connection between cooling source and DUT.

In an embodiment, the method comprises providing the device under test and the cooling unit with substantially identical mutual contact areas. By providing substantially the same areas on the top side of the cooling plate and on the bottom side of the device under test, a compact configuration may be obtained.

In an embodiment, the prober is configured as a wafer prober for testing chips (in particular semiconductor chips) on a wafer as device under test. Thus, the prober may be configured for testing a wafer, in particular a plurality of electronic chips which are still integrally connected in the wafer compound. The wafer and its electronic chips may have electrically conductive pads and/or other electrically conductive parts on one or both opposing main surfaces thereof which need to be contacted to apply electric test signals and to measure electric response signals for testing functionality of the electronic chips and the wafer as a whole. A corresponding wafer prober may be capable of accommodating the wafer above a planar surface of a chuck and on a cooling plate having electrically conductive portions which may be contacted with electrically conductive pads on one main surface of the wafer. A needle card, for instance, having a plurality of electrically conductive needles may contact pads on an opposing other main surface of the wafer placed above the chuck with a cooling plate in between.

In an embodiment, the transport circuitry of the prober comprises electrically conductive contact elements for applying an electric stimulus signal to at least one side of the device under test and/or for detecting an electric response signal in response to the applied electric stimulus signal on at least one side of the device under test. The mentioned electrically conductive elements may be needles or pogo pins (i.e. spring-loaded electrically conductive contacts) contacting pads and/or other electrically conductive parts on one main surface of the wafer or other devices under test. Other contact elements may be planar electrically conductive regions on a surface of the cooling plate on which the device under test may be directly placed. When the device under test is sandwiched between electrically conductive elements on both opposing main surfaces, it is possible to carry out electric tests by applying electric stimulus signals and by measuring electric response signals on respective ones of the pads and/or other electrically conductive parts via respective ones of the contact elements.

In an embodiment, the method comprises testing integrally connected dies or chips of a wafer as the device under test, in particular a wafer having a diameter of at least 150 mm, more particularly at least 300 mm. In particular with a semiconductor wafer of large dimensions up to 300 nm diameter and more, conventional prober and cooling concepts may be no longer applicable and available.

In an embodiment, the method comprises testing, as the device under test, a wafer comprising a plurality of semiconductor chips having a vertical current flow between two opposing main surfaces. Testing semiconductor chips with a vertical current flow (for instance transistor chips) may implement pads and/or other electrically conductive parts on both opposing main surfaces of the wafer under test.

In an embodiment, the electronic chip is a FET (Field Effect Transistor) transistor chip having a source pad, a drain pad and a gate pad or may be an IGBT (Insulated Gate Bipolar Transistor) chip having a collector pad, an emitter pad and gate pad as the at least one pad. In particular, the source pad and the gate pad may be formed on the same main surface of the electronic chip and may be each coupled with a respective contact element. The drain pad may be formed on an opposing other main surface of the electronic chip. Such a transistor chip may be a chip fulfilling the function of a transistor, in particular of a field effect transistor. Such a transistor chip may be used for instance for semiconductor power applications.

In an embodiment, the at least one electronic chip comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a FET, Field Effect Transistor or IGBT, Insulated Gate Bipolar Transistor), at least one diode, etc. In particular, circuits fulfilling a half-bridge function, a full-bridge function, etc., may be manufactured.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

Before exemplary embodiments will be described in more detail referring to the figures, some general considerations will be summarized based on which exemplary embodiments have been developed.

According to an exemplary embodiment, a prober for a test system for testing devices under test is provided which comprises a cooling unit with a (preferably liquid) cooled chuck-add-on-plate. This may ensure to comply with high thermal power demands in a wafer prober. Thus, embodiments may provide a significantly reduced thermal resistance from the heat-dissipating wafer to the cooling liquid and may thus support high cooling demands of massive parallel burn-in test of power semiconductors.

It may be desirable to enable a special kind of burn-in of MOSFETs, the so-called Bipolar Stress Screening (BIPSS), on wafer-level. To do this with reasonable effort, reasonably short test times per wafer are desired. This directly translates into a high number of chips that should be tested at the same time. Preferably, the test parallelism can be higher than 100.

During burn-in, each semiconductor chip may dissipate up to 100 W electrical power constantly over a burn-in time of for instance at least 15 minutes. This can sum up to more than 10 kW steady power dissipation for 100 times parallel test. Because of the steady nature of the power dissipation, buffering thermal capacitances may be of no relevance. This means that the whole thermal power can be transferred away from the wafer instantaneously to not exceed a maximum allowed temperature.

The main heat transfer mechanism for this may be heat conduction towards the mechanical construction where the wafer lies on and where the cooling facilities are implemented.

Additionally, since power semiconductor chips and wafers may be vertical devices with electrically active back side, the plate the wafer lies on should be electrically isolated from the prober. This isolation can be done with a dielectric plate, which on the other hand represents an unwanted thermal resistance and hence constricts the heat flow.

Conventionally, there is no solution available that provides the needed heat transfer and cooling capabilities. In particular, there is no solution available that has a thermal power capability of 10 kW and more.

For power semiconductor testing, an electrically isolating plate may be arranged conventionally above the chuck and below the so-called add-on-plate, where the wafer lies on. This represents a high thermal resistivity that constricts the heat transfer from the wafer to the cooled chuck.

An exemplary embodiment provides a prober having a cooling unit contacting the device under test directly. More specifically, a liquid cooled add-on-plate may be provided which is in close contact with the wafer or other DUT. This may overcome the drawback of conventional approaches of a high thermal resistivity of a sandwiched dielectric plate and its interfaces.

With embodiments, it may be possible that the thermal resistance is significantly improved over conventional approaches with isolating plate between wafer and the cooling chuck.

A model (which may use an electro-thermal analogy) of the heat flow and temperature gradients contains one component which cannot be derived just from theory. This is the heat transfer at the interface from wafer backside to add-on-plate surface. It cannot be calculated exactly because the necessary parameters of both surfaces (roughness, elastic behavior, etc.) are not known well enough. This is accepted throughout the simulation community and a way to overcome this situation is to measure the temperature difference in experiments, feed the simulation model with the result and then do predictions with the simulation for different dimensions, geometries etc.

To obtain a good estimation for the temperature difference, a simplified experiment was conducted. A wafer of similar thickness like MOSFETs and with an integrated temperature sensor was exposed to a 125° C. air stream. The chuck was held at 25° C. and the temperature of the wafer was measured to be 31° C. The interface wafer-chuck caused in this setup a temperature difference of just 6 K. A setup for BIPSS according to an exemplary embodiment may be much better in terms of thermal resistance, since the wafer may be pushed directly onto a cooled add-on-plate by about 1000 probes with about 50 kg. So, the estimation shows that the heat flow of 10 kW may only cause a temperature difference of less than 10 K between wafer and add-on-plate.

Figure 1:
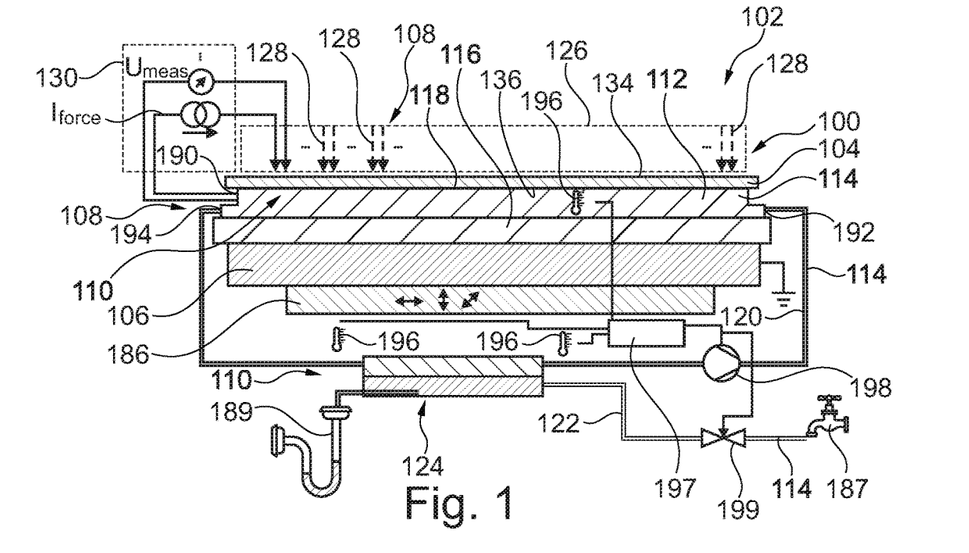
FIG. 1 shows a schematic view of a test system comprising an electric test unit and a prober with a direct cooling unit according to an exemplary embodiment.

FIG. 1 shows a schematic view of a test system 102 comprising an electric test unit 130 and a prober 100 according to an exemplary embodiment. More specifically, prober 100 is configured as a wafer prober 100 for testing chips on a wafer as device under test 104. The test system 102 thus serves for testing the device under test 104, which is here a semiconductor wafer composed of a plurality of integrally connected transistor chips.

The prober 100 forms the mechanical part of the test system 102 and is used for handling the device under test 104. The electric test unit 130 is coupled with the prober 100 and serves for supplying electric stimulus signals to the prober 100 and for analysing electric response signals from the prober 100 in terms of the test. The prober 100 comprises electrically conductive contact elements (which will be described below in further detail) for applying the electric stimulus signals to at least one side of the device under test 104 and for detecting the electric response signals in response to the applied electric stimulus signals on at least one side of the device under test 104.

The shown prober 100 comprises a chuck 106 configured for mechanically carrying or supporting the device under test 104. Furthermore, the prober 100 comprises an electric transport circuitry 108 for transporting electric signals to and/or away from the device under test 104.

Beyond this, prober 100 comprises a cooling unit 110 which is directly thermally and physically coupled with the device under test 104 and which is configured for cooling the device under test 104 during operation of the test system 102. Electric test unit 130 of test system 102 is coupled with the transport circuitry 108 of the prober 100 for supplying the electric stimulus signals to the prober 100 and for analysing the electric response signals from the prober 100. Referring to FIG. 1, an electric current $I_{force}$ may be provided by the test unit 130 and may be applied to the device under test 104 by the transport circuitry 108. Moreover, a voltage $U_{meas}$ between a top side of the device under test 104 and a cooling plate 112 of the cooling unit 110 on which the device under test 104 rests may be measured by the test unit 130.

More specifically, the cooling unit 110 comprises a circular cooling plate 112 corresponding to the circular shape of the wafer-type device under test 104. The cooling unit 110 is configured for cooling the device under test 104 from a bottom side thereof by a liquid coolant being drivable through channels 114 (see also FIG. 3) of the cooling unit 110. As shown in FIG. 1, cooling of the wafer-type device under test 104 is accomplished at its lower main surface which faces the chuck 106. As a consequence, the upper main surface of the device under test 104 opposing (or facing away from) the chuck 106 remains freely exposed from any elements of the cooling unit 110. This makes it possible to contact the upper main surface of the device under test 104 by multiple electrically conductive contact elements 128 (for instance spring contacts) of a needle array 108 (which may also be denoted as full wafer prober array).

The chips of the wafer-type device under test 104 experience a vertical current flow according to FIG. 1. When at the same time a significant voltage drop between upper and lower main surface occurs, an enormous portion of ohmic heat is generated by such a current flow in the device under test 104. Heat removal by an active cooling at the lower main surface of the device under test 104, as performed by the cooling unit 110 operating by its cooling plate 112 specifically and directly at the lower main surface of the device under test 104, is therefore particularly efficient.

Furthermore, the prober 100 comprises an electrically insulating body 116 arranged vertically between the cooling plate 112 of the cooling unit 110 and the chuck 106. Preferably, the electrically insulating body 116 is an electrically insulating plate (such as a ceramic plate) which mutually spaces the cooling plate 112 with respect to the chuck 106. The electrically insulating body 116 thus electrically decouples the chuck 106 with respect to the device under test 104.

As can be taken from FIG. 1, the cooling plate 112 comprises an electrically conductive surface 118 in direct physical contact with the bottom main surface of the device under test 104. By taking this measure, a highly efficient thermal coupling between device under test 104 and cooling plate 112 can be ensured.

More specifically, the cooling unit 110 comprises a first cooling path 120 circulating a liquid first coolant through the cooling plate 112 which is in contact with the device under test 104. When heated, the device under test 104 transfers heat to the circulating first coolant. Furthermore, the cooling unit 110 may additionally comprise a second cooling path 122 driving a liquid second coolant from a source 187 to a drain 189. A heat exchanger 124 may be provided for thermally coupling the first coolant flowing through the first cooling path 120 with the second coolant flowing through the second cooling path 122. As a result, heat is transferred from the first coolant to the second coolant in the heat exchanger 124. Consequently, the previously heated first coolant is cooled by the second coolant, so that the cooled first coolant can then be circulated back to the cooling plate 112. This procedure can be carried out continuously. In view of this highly efficient and direct cooling mechanism, the cooling unit 110 can be operated for cooling the device under test 104 with a thermal power capability of for example 10 kW or more.

What concerns the transmission of electric signals and electric power within the test system 102, the transport circuitry 108 of the prober 100 comprises needle card 126 with its electrically conductive contact elements 128 which are configured for contacting the device under test 104 from a top side. Furthermore, the electrically conductive surface 118 on the top side of the cooling plate 112 comprises one or more electrically conductive contact elements configured for contacting the device under test 104 from a bottom side. As can be taken from FIG. 1 as well, the transport circuitry 108 is electrically coupled with the cooling unit 110 for transporting electric signals to and/or away from the device under test 104 via the cooling unit 110. Thus, the cooling plate 112 also contributes to the transmission of electric signals between electric test unit 130 and device under test 104.

Advantageously, the electric test unit 130 may be configured for supplying burn-in stimulus signals to wafer-type device under test 104 by the electrically conductive contact elements 128 and by the electrically conductive surface 118. Preferably but not necessarily, such burn-in stimulus signals may be provided for forcing bipolar degradation to the chips of the wafer-type device under test 104. Highly advantageously, the electric test unit 130 may be configured for supplying the burn-in stimulus signals to multiple or even all semiconductor chips of the wafer-type device under test 104 in parallel or simultaneously. Thus, it may be possible to carry out the burn-in procedure for forcing bipolar degradation to wafer-type device under test 104 on wafer level and simultaneously at least for a subgroup of the chips.

For testing the device under test 104, the device under test 104 is mounted directly on the cooling plate 112 above the chuck 106. Hence, the device under test 104 is attached to rest on the cooling plate 112. As a result, the device under test 104 may be directly cooled by the cooling unit 110, since cooling plate 112 is directly thermally coupled with the device under test 104. Advantageously, the device under test 104 and the cooling plate 112 are provided with substantially identical mutual contact areas. This ensures a proper thermal coupling over a large connection surface. The test and burn-in of the chips is carried out on a wafer as the device under test 104. For instance, the wafer may have a diameter of 150 mm to 300 mm or more. The wafer may comprise a plurality of power semiconductor chips having a vertical current flow between two opposing main surfaces 134, 136.

The liquid cooled add-on-plate or cooling plate 112 can preferably contain bifilar spiral cooling tubes as channels 114 within a thermally conductive plate body of the cooling plate 112. This may ensure a proper homogeneity of the temperature distribution on the surface of the add-on-plate 112. The diameter of the cooling tubes may be preferably large enough to enable a sufficient flow rate of the cooling liquid.

In terms of a massive parallel testing operation with a full-wafer probe array in form of the illustrated needle array 126, the heat may be induced over the whole wafer area nearly homogeneously. Lateral thermal gradients within a horizontal plane may be neglectable. Exemplary embodiments address bipolar degradation that occurs in the early lifetime of SiC MOSFETs and leads to a permanently increased on-resistance Ron. This drift can be prevented to happen during use of the chips when a burn-in is performed during testing, where the degradation is forced. For instance, chips with too high on-resistance may be sorted out after the burn-in procedure.

Next, operation of the prober 100 and the test system 102 of FIG. 1 will be explained in further detail.

For testing, the wafer-type device under test 104 is placed on the electrically conductive and highly thermally conductive cooling plate 112 of the prober 100. For instance, the device under test 104 may be a very thin semiconductor wafer, for instance having a thickness in a range between 50 μm and 200 μm. Although not shown in detail, the cooling plate 112 comprises one or more electrically conductive portions on its electrically conductive surface 118 accomplishing an electric connection between the lower main surface of the device under test 104 and the electric test unit 130. On the upper main surface of the device under test 104, a plurality of electrically conductive contact elements 128 of the needle card 126 contacts pads of the wafer. For instance, the number of needle-type electrically conductive contact elements 128 may be at least 100, in particular at least 1000. Descriptively speaking, the needles press on the top main surface of the device under test 104 and therefore promote a proper physical and also thermal coupling between the lower main surface of the device under test 104 and the upper main surface of the cooling plate 112. Beneath the cooling plate 112, a ceramic plate is provided as electrically insulating body 116. The electrically insulating body 116 ensures a dielectric decoupling of the device under test 104 and the metallic cooling plate 112 in a downward direction.

As shown as well in FIG. 1, the cooling unit 110 comprises, in addition to the cooling plate 112, the closed cooling path (see reference numeral 120) and the open cooling path (see reference numeral 122) actively cooling the cooling plate 112 by two cooperating flows of liquid coolants. Along the open cooling path (see reference numeral 122), a liquid coolant such as water flows from source 187 to drain 189 and hereby also flows through the heat exchanger 124. The closed cooling path (see reference numeral 120) provides another cooling liquid which also flows through the heat exchanger 124 and through the cooling plate 112. At the cooling plate 112, the coolant in the closed cooling path is heated by heat generated by the wafer-type device under test 104 during testing and carrying out the burn-in procedure. This heat is transferred firstly to the circulating coolant and from there to the other coolant in the open cooling path in the heat exchanger 124. Thereby, a highly efficient and continuous transfer of heat from the device under test 104 via the cooling plate 112 to the first coolant and from therefore to the second coolant can be obtained.

During operation of the test system 102, electric signals may be supplied in a massive parallel way from the electric test unit 130 via the electrically conductive contact elements 128 of the needle card 126 to the upper main surface of the device under test 104. A resulting electric response is transferred from the lower main surface of the device under test 104 and by the electrically conductive surface 118 of the cooling plate 112 back to the electric test unit 130. The current flow through the device under test 104 is vertical. When carrying out a burn-in procedure, a bipolar degradation of a group of or preferably all semiconductor chips of the wafer-type device under test 104 is triggered by applying corresponding electric signals by the needle card 126. Said signals introduce a high amount of heat into the device under test 104. This heat is removed at least partially by the cooling unit 110, as described above.

During operation, the needle card 126 may remain stationary or spatially fixed. In contrast to this, a movable stage 186 may be capable of spatially moving the chuck 106, the electrically insulating body 116, the cooling plate 112 and the device under test 104. Preferably, this motion can be carried out in all three orthogonal spatial directions, as indicated schematically in FIG. 1 by three double arrows).

As indicated in FIG. 1 as well, the chuck 106 may for instance be electrically grounded. Electric signals applied by the electrically conductive contact elements 128 to pads on the upper main surface of the wafer-type device under test 104 may for instance have a voltage of more than 1000 V, for instance 2500 V.

A lower main surface of the device under test 104 may be in direct physical contact with an electrically conductive upper main surface of the cooling plate 112. As a result, a proper thermal coupling between the device under test 104 and the cooling plate 112 may be ensured. Simultaneously, the cooling plate 112 also provides an electric function by electrically coupling a lower main surface of the device under test 104 with the test unit 130 for transporting electric signals and electric power between device under test 104 and test unit 130. For example, the lower main surface of the wafer-type device under test 104 may be a continuous or substantially continuous electrically conductive layer. Said electrically conductive layer may be in physical contact with the electrically conductive surface 118 (for instance a gold layer) on an upper main surface of the cooling plate 112. For instance, the cooling plate 112 may be made of stainless steel with said gold layer on top thereof. On the upper main surface of the wafer-type device under test 104, separate pads of the various chips may be formed which are brought in electrically conductive contact with the electrically conductive contacts elements 128.

As shown with reference sign 190, the cooling plate 112 has an electric interface for transmitting electric signals and/or electric power. As shown with reference signs 192, 194, the cooling plate 112 additionally has thermal interfaces for supplying and draining coolant.

It is also possible to provide one or multiple temperature sensors 196 at one or more positions of the cooling system. Corresponding temperature data may be supplied to a control unit 197 which may control, based on said temperature values, a cooling fluid drive unit 198 (such as a pump) for circulating the first coolant accordingly. The control unit 197 may also control a valve 199 to trigger supply of second coolant in accordance with the present temperature conditions within the test system 102.

Figure 2:
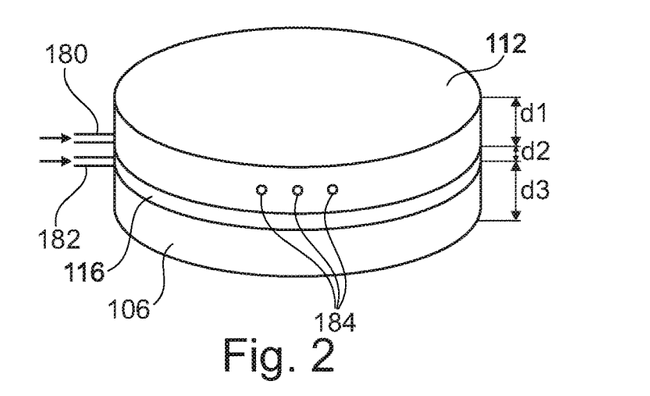
FIG. 2 shows a three-dimensional view of a cooling plate of a prober according to an exemplary embodiment.

FIG. 2 shows a three-dimensional view of a cooling plate 112 of a prober 100 (such as the one shown in FIG. 1) according to an exemplary embodiment.

FIG. 2 shows the cooling plate 112 with fluidic interfaces 180, 182 for providing and draining the respective coolant, as described above. More specifically, fluidic interface 180 supplies a cooling fluid, whereas fluidic interface 182 drains a cooling fluid, as indicated by arrows in FIG. 2. Furthermore, FIG. 2 shows vacuum connections 184. By the vacuum connections 184, a vacuum may be applied to the upper main surface of the cooling plate 112 for holding the device under test 104 on the cooling plate 112 by a vacuum suction force. Thus, a proper electric connection and a reliable thermal coupling between the device under test 104 and the cooling plate 112 may be ensured by the vacuum suction mechanism. Moreover, it may be possible that one or more of the vacuum connections 184 may apply a vacuum to a lower main surface of the cooling plate 112 for properly holding together the cooling plate 112 and the electrically insulating body 116, for instance a ceramic plate.

For example, a thickness, d1, of the cooling plate 112 may be in a range between 10 mm and 30 mm, in particular in a range between 10 mm and 20 mm. A thickness, d2, of the plate-shaped electrically insulating body 116 may be in a range between 1 mm and 10 mm, in particular in a range between 2 mm and 6 mm. A thickness, d3, of the plate-shaped chuck 106 may be in a range between 10 mm and 40 mm, in particular in a range between 10 mm and 30 mm.

Figure 3:
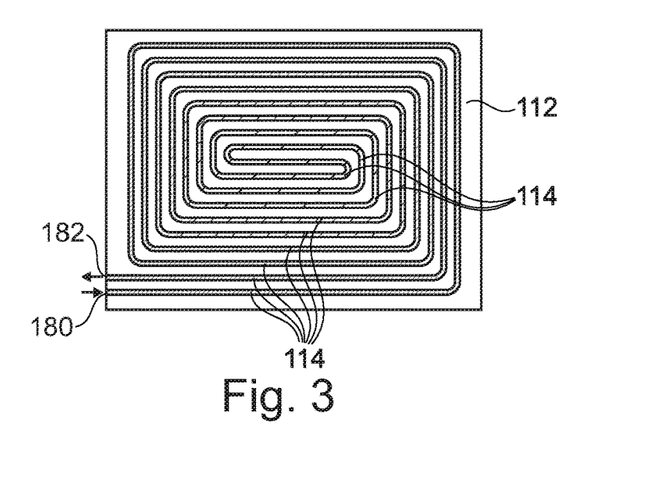
FIG. 3 shows a plan view of a cooling plate of a prober according to an exemplary embodiment.

FIG. 3 shows a plan view of a cooling plate 112 (such as the one shown in FIG. 2) of a prober 100 (such as the one shown in FIG. 1) according to an exemplary embodiment. As shown in FIG. 3, the cooling unit 110 may be configured for cooling the device under test 104 by the fluidic coolant being drivable through spiral channels 114 in the cooling unit 110. Said spiral channels 114 are configured as bifilar spiral cooling tubes according to FIG. 3. While FIG. 3 shows a substantially rectangular arrangement of the spiral channels 114, the arrangement may also be for example circular.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A prober for a test system for testing a device under test, wherein the prober comprises:
   a chuck configured for carrying the device under test;
   a transport circuitry for transporting electric signals to and/or away from the device under test;
   a cooling unit including a cooling plate, the cooling unit to directly thermally couple to the device under test and to cool the device under test at a main surface of the device under test facing the chuck via a first major surface of the cooling plate which is to physically contact the device under test, the cooling plate electrically coupled to the transport circuitry with the first major surface including electrically conductive portions to carry the electrical signals to and/or away from the device under test; and
   an electrically insulating body arranged between the cooling plate of the cooling unit and the chuck.

2. The prober according to claim 1, wherein the cooling plate is a circular cooling plate.

3. The prober according to claim 1, wherein the cooling unit is configured for cooling the device under test by a fluidic coolant being drivable through channels of the cooling unit.

4. The prober according to claim 3, wherein the cooling unit is configured for cooling the device under test by a liquid coolant.

5. The prober according to claim 3, wherein the cooling unit is configured for cooling the device under test by the fluidic coolant being drivable through spiral channels in the cooling unit, in particular bifilar spiral cooling tubes.

6. The prober according to claim 5, wherein the electrically insulating body is an electrically insulating plate, in particular a ceramic plate or a plastic plate.

7. The prober according to claim 1, wherein the cooling unit comprises an electrically conductive surface in contact with the device under test.

8. The prober according to claim 1, wherein the cooling unit is configured for cooling the device under test with a thermal power capability of at least 5 kW, in particular of at least 10 kW.

9. The prober according to claim 1, wherein the transport circuitry comprises a needle card comprising electrically conductive contact elements configured for electrically contacting the device under test, in particular for contacting the device under test from a main surface of the device under test facing away from the chuck.

10. The prober according to claim 1, wherein the transport circuitry comprises electrically conductive contact elements, in particular spring contacts, for applying an electric stimulus signal to at least one side of the device under test and/or for detecting an electric response signal in response to the applied electric stimulus signal on at least one side of the device under test.

11. The prober according to claim 1, wherein the cooling unit comprises one or more electrically conductive contact elements configured for electrically contacting the device under test, in particular for electrically contacting the device under test at the main surface of the device under test facing the chuck.

12. The prober according to claim 1, comprising at least one of the following features:
   configured as a wafer prober for testing chips of a wafer as device under test;
   wherein at least the part of the cooling unit being directly thermally coupled with the device under test is highly thermally conductive, in particular has a thermal conductivity of at least 10 W/mK, preferably at least 80 W/mK.

13. A test system for testing a device under test, wherein the test system comprises:
   a prober according to claim 1; and
   an electric test unit coupled with the transport circuitry of the prober for supplying electric stimulus signals to the prober and for analysing electric response signals from the prober, wherein the electric test unit is configured for supplying burn-in stimulus signals to a wafer-type device under test, in particular for forcing bipolar degradation to the wafer-type device under test.

14. The test system according to claim 13, wherein the electric test unit is configured for supplying the burn-in stimulus signals to multiple, in particular all, semiconductor chips of the wafer-type device under test in parallel.

15. A prober for a test system for testing a device under test, wherein the prober comprises:
   a chuck configured for carrying the device under test;
   a transport circuitry for transporting electric signals to and/or away from the device under test;
   a cooling unit directly thermally coupled with the device under test and configured for cooling the device under test at a main surface of the device under test facing the chuck; and
   an electrically insulating body arranged between a cooling plate of the cooling unit and the chuck, wherein the cooling unit comprises:
   a first cooling path circulating a first coolant through the cooling plate in contact with the device under test;
   a second cooling path for driving a second coolant, in particular from a source to a drain or in a circulating manner; and
   a heat exchanger thermally coupling the first cooling path with the second cooling path so that heat is transferable from the first coolant to the second coolant.

16. A method of testing a device under test, wherein the method comprises
   carrying the device under test by a chuck;
   cooling the device under test, at a main surface of the device under test facing the chuck, by cooling plate of a cooling unit which is directly thermally coupled with the device under test;
   transporting electric signals to and/or away from the device under test, including via a electrically conductive portions of the cooling plate which are in physical contact with the device under test; and
   arranging an electrically insulating body between the cooling plate of the cooling unit and the chuck.

17. The method according to claim 16, comprising at least one of the following features:
   wherein the method comprises carrying out a burn-in procedure for multiple semiconductor chips of a wafer-type device under test simultaneously;

wherein the method comprises supplying burn-in stimulus signals to a wafer-type device under test, in particular for forcing bipolar degradation of the wafer-type device under test;

wherein the method comprises carrying out a burn-in procedure, in particular for forcing bipolar degradation, to a wafer-type device under test on wafer level;

wherein the method comprises attaching the device under test to rest with physical contact on the cooled cooling plate of the cooling unit;

wherein the method comprises providing the device under test and the cooling unit with substantially identical mutual contact areas;

wherein the method comprises testing chips of a wafer as the device under test, in particular chips of a wafer which has a diameter of at least 150 mm; and wherein the method comprises testing, as the device under test, a wafer comprising a plurality of semiconductor chips having a vertical current flow between two opposing main surfaces.

18. The method according to claim 16, wherein the method comprises:

applying an electric current to the device under test by a transport circuitry; and measuring a voltage between a top side of the device under test and the cooling plate of the cooling unit on which the device under test rests.

* * * * *